United States Patent
Yu et al.

(10) Patent No.: US 12,036,931 B2
(45) Date of Patent: Jul. 16, 2024

(54) AVN DEVICE

(71) Applicant: LG Electronics Inc., Seoul (KR)

(72) Inventors: Jiwon Yu, Seoul (KR); Kangseok Moon, Seoul (KR); Wonmoog Jung, Seoul (KR); Joongnyon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 254 days.

(21) Appl. No.: 17/563,671

(22) Filed: Dec. 28, 2021

(65) Prior Publication Data

US 2022/0118921 A1 Apr. 21, 2022

Related U.S. Application Data

(63) Continuation of application No. PCT/KR2019/007870, filed on Jun. 28, 2019.

(51) Int. Cl.
*B60R 16/023* (2006.01)
*G06F 1/20* (2006.01)
(Continued)

(52) U.S. Cl.
CPC ............ *B60R 16/0231* (2013.01); *G06F 1/20* (2013.01); *H05K 5/0026* (2013.01);
(Continued)

(58) Field of Classification Search
CPC .. G06F 1/203; G06F 2200/203; G06F 1/1681; G06F 1/206; G06F 2200/201;
(Continued)

(56) References Cited

U.S. PATENT DOCUMENTS 6,084,769 A * 7/2000 Moore ................... G06F 1/203
361/679.52
6,191,943 B1 * 2/2001 Tracy ..................... G06F 1/203
361/679.55
(Continued)

FOREIGN PATENT DOCUMENTS

EP 1672642 6/2006
EP 2261812 12/2010
(Continued)

OTHER PUBLICATIONS

Extended European Search Report in European Appln. No. 19935607.2, dated Jan. 2, 2023, 6 pages.
(Continued)

*Primary Examiner* — Michael A Matey
(74) *Attorney, Agent, or Firm* — Fish & Richardson P.C.

(57) ABSTRACT

An audio video navigation (AVN) device includes: a first housing including a first circuit board, a second housing that includes a second circuit board and that detachably couples to the first housing, a conduction module provided between a first coupling surface of the first housing and a second coupling surface of the second housing based on the second housing being coupled to the first housing, and a heat dissipation fan that is provided at the first housing and that is configured to exhaust air inside the first housing to an outside of the first housing. The conduction module includes: a first surface coupled to one of the first coupling surface or the second coupling surface, and a second surface facing the other one of the first coupling surface or the second coupling surface, where the second surface is not adhesive.

17 Claims, 5 Drawing Sheets

(51) Int. Cl.
  *H05K 5/00* (2006.01)
  *H05K 5/02* (2006.01)
  *H05K 7/20* (2006.01)

(52) U.S. Cl.
  CPC ....... *H05K 5/0208* (2013.01); *H05K 7/20136* (2013.01); *H05K 7/2039* (2013.01)

(58) Field of Classification Search
  CPC ........ G06F 1/20; G06F 1/1601; G06F 1/1616; G06F 1/1618; G06F 1/1637; G06F 1/1613; G06F 2200/202; G06F 3/167; B60R 11/0252; H05K 7/2039; H05K 2201/066; H05K 5/0226; F28F 2013/006; F28F 2280/105; H04M 1/0214; H04M 1/0268; H01Q 1/2266
  See application file for complete search history.

(56) References Cited

U.S. PATENT DOCUMENTS

| | | | | |
|---|---|---|---|---|
| 6,415,612 | B1* | 7/2002 | Pokharna | H01L 23/38 62/3.2 |
| 7,288,895 | B2* | 10/2007 | Rossi | H01J 61/52 315/112 |
| 11,272,639 | B2* | 3/2022 | Yang | G06F 1/203 |
| 11,744,045 | B2* | 8/2023 | Lin | G06F 1/203 361/679.54 |
| 2002/0051339 | A1* | 5/2002 | Ohashi | G06F 1/203 361/679.46 |
| 2004/0042174 | A1* | 3/2004 | Tomioka | G06F 1/203 361/679.53 |
| 2004/0114324 | A1* | 6/2004 | Kusaka | G06F 1/203 361/699 |
| 2004/0188069 | A1* | 9/2004 | Tomioka | G06F 1/206 257/E23.098 |
| 2006/0209512 | A1* | 9/2006 | Taniguchi | G06F 1/203 165/80.4 |
| 2007/0070599 | A1* | 3/2007 | Chang | G06F 1/203 361/679.52 |
| 2008/0130221 | A1* | 6/2008 | Varadarajan | G06F 1/203 361/679.52 |
| 2009/0323276 | A1* | 12/2009 | Mongia | G06F 1/203 361/679.52 |
| 2014/0098489 | A1* | 4/2014 | Chiriac | H05K 7/20436 312/236 |
| 2018/0196467 | A1* | 7/2018 | Watamura | G06F 1/1626 |
| 2018/0224909 | A1* | 8/2018 | Koo | H02J 50/10 |
| 2018/0267578 | A1* | 9/2018 | Ho | G06F 1/206 |
| 2018/0284856 | A1* | 10/2018 | Shah | G06F 1/1616 |
| 2019/0189042 | A1* | 6/2019 | Aurongzeb | G06F 1/1681 |
| 2021/0103317 | A1* | 4/2021 | Raju | G06F 1/203 |
| 2021/0109575 | A1* | 4/2021 | Yang | G06F 1/1681 |
| 2021/0385967 | A1* | 12/2021 | Hsiao | G06F 1/182 |
| 2022/0322544 | A1* | 10/2022 | Chun | G06F 1/1681 |

FOREIGN PATENT DOCUMENTS

| | | |
|---|---|---|
| EP | 3461249 | 3/2019 |
| FR | 3060202 | 6/2018 |
| JP | H11251775 | 9/1999 |
| JP | 2003291745 | 10/2003 |
| JP | 2005268343 | 9/2005 |
| KR | 20-0385591 | 5/2005 |
| WO | WO 2009025524 | 2/2009 |
| WO | WO2016162211 | 10/2016 |

OTHER PUBLICATIONS

International Search Report and Written Opinion in International Appln. No. PCT/KR2019/007870, dated Mar. 26, 2020, 15 pages (with English translation).

* cited by examiner

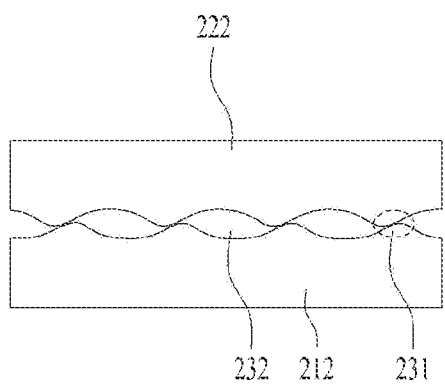
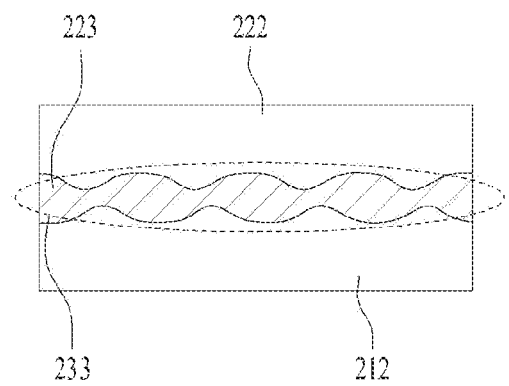
FIG. 4A
FIG. 4B ns in manip-
AVN DEVICE

CROSS-REFERENCE TO RELATED APPLICATIONS

Pursuant to 35 U.S.C. § 119(e), this application is a continuation of International Application PCT/KR2019/007870, with an international filing date of Jun. 28, 2019, which is herein incorporated by reference in its entirety.

TECHNICAL FIELD

The present disclosure relates to an audio video navigation (AVN) device, and more particularly to an AVN device configured in a manner that a replaceable portion including any element having a short replacement cycle is detachably coupled to a fixed portion, and the AVN device can perform cooling through the fixed portion.

BACKGROUND

An audio video navigation (AVN) device is a vehicle-dedicated multimedia device which integrates an audio device, a video device, and a navigation device into a single unit. The AVN device can provide convenience in manipulating various multimedia devices and an efficient use of an internal space of the vehicle.

In recent years, an AVN device has been manufactured as a built-in AVN device that is built in and attached to the vehicle, and the built-in AVN device has been manufactured together with the vehicle and rapidly introduced to the market. The built-in AVN device has advantages in that the internal space of the vehicle can be more efficiently utilized, but has disadvantages in that the built-in AVN device can be manufactured differently depending on vehicle models, and replacement of the built-in AVN device is inconvenient. Considering that the lifespan of the AVN device is generally shorter than that of the vehicle, the necessity for the user to easily replace the AVN device with a desired device from among the latest devices is emerging.

In addition, the AVN device is a device that performs complex functions, and the replacement cycles of elements required to implement the functions may be different from each other. The replacement cycles of such elements may be determined differently according to the development speed of technology, or may also be determined differently according to durability. When the AVN device is manufactured as an integrated unit, it would be inefficient to replace the entire device with a new device in a situation where there is a need to replace only some elements included in the device with other elements.

In addition, the AVN device is a small device that requires a large amount of computation in response to complex information, and a structure capable of effectively emitting internal heat is of importance to development of the AVN device.

SUMMARY

The present disclosure is directed to an AVN device that can substantially obviate one or more problems due to limitations and disadvantages of a conventional AVN device.

The present disclosure is also directed to an AVN device that provides a replaceable portion detachably coupled to the AVN device and a fixed portion fixed to a vehicle.

The present disclosure is also directed to an AVN device including a replaceable portion including one or more elements each having a short replacement cycle, thereby efficiently upgrading the AVN device.

The present disclosure is also directed to an AVN device in which heat exchange between the replaceable portion and the fixed portion can be facilitated, thereby increasing heat dissipation efficiency of the replaceable portion.

According to one aspect of the subject matter described in this application, an audio video navigation (AVN) device can include a first housing including a first circuit board, a second housing that includes a second circuit board and that detachably couples to the first housing, a conduction module provided between a first coupling surface of the first housing and a second coupling surface of the second housing based on the second housing being coupled to the first housing, and a heat dissipation fan that is provided at the first housing and that is configured to exhaust air inside the first housing to an outside of the first housing. The conduction module can include a first surface coupled to one of the first coupling surface or the second coupling surface, and a second surface facing the other one of the first coupling surface or the second coupling surface, where the second surface is not adhesive.

Implementations according to this aspect can include one or more of the following features. For example, the conduction module can include an adhesive sheet that has a first surface attached to the first housing or the second housing, a thermally conductive sheet stacked on a second surface of the adhesive sheet, and a non-adhesive sheet that is stacked on the thermally conductive sheet and that defines a non-adhesive surface.

In some implementations, a thickness of the conduction module can be greater than an assembly tolerance between the first housing and the second housing, and the conduction module can be compressed according to a degree of compression of the first housing that is compressed based on the first housing being coupled to the second housing, so that a surface of the conduction module is in contact with the first housing and the second housing. In some implementations, the AVN device can include a first electronic component mounted in the first housing, and a second electronic component mounted in the second housing and having a shorter replacement cycle than the first electronic component.

In some examples, the first electronic component can be a fixed component that includes at least one of a vehicle interlocking component, a radio, or an audio device, and the second electronic component can be a replaceable component that includes at least one of a CPU, a memory, or a communication device. In some implementations, the first housing can include a plurality of metal fins protruding from an inner surface of the first coupling surface, and the heat dissipation fan can be configured to guide a flow of the air inside the first housing through the plurality of metal fins.

In some implementations, the first housing can include an accommodation space in which the second housing is accommodated and in which the first coupling surface is placed. In some examples, the second housing can include a coupling surface that is in contact with a coupling portion of the first housing, and an exposed surface that is exposed to an outside of the second housing.

In some implementations, the first housing can further include a metal sheet that covers the conduction module and that couples the conductive module to the first coupling surface. In some implementations, the AVN device can include a terminal electrically connecting the first circuit board and the second circuit board based on the first housing and the second housing being coupled to each other.

In some examples, the AVN device can further include a first electronic component mounted in the first housing, and a second electronic component that is mounted in the second housing and that has a shorter replacement cycle than the first electronic component. The second electronic component can be a processor, and the processor can control an operation of the AVN device based on the first circuit board and the second circuit board being connected by the terminal. In some examples, the inner surface of the first coupling surface can face an outer surface of the first housing that contacts the second housing.

In some implementations, the fixed component can include the vehicle interlocking component, the radio, and the audio device, and the replaceable component can include the CPU. In some examples, the fixed component can include the vehicle interlocking component, the radio, and the audio device, and the replaceable component can include the memory. In some examples, the fixed component can include the vehicle interlocking component, the radio, and the audio device, and the replaceable component can include the communication device.

In some implementations, the fixed component can include the vehicle interlocking component and the radio, and the replaceable component can include the CPU. In some examples, the fixed component can include the vehicle interlocking component and the radio, and the replaceable component can include the memory. In some examples, the fixed component can include the vehicle interlocking component and the radio, and the replaceable component can include the communication device.

In some implementations, the fixed component can include the vehicle interlocking component, the radio, and the audio device, and the replaceable component can include the CPU, the memory, and the communication device. In some examples, the fixed component can include the radio and the audio device, and the replaceable component can include the CPU, the memory, and the communication device.

The AVN device can have the following effects.

The AVN device can provide a replaceable portion that is detachably coupled to the AVN device and a fixed portion that is fixed to a vehicle.

The AVN device can provide a replaceable portion that includes one or more elements each having a short replacement cycle, thereby efficiently upgrading the AVN device.

The AVN device can facilitate heat exchange between the replaceable portion and the fixed portion, thereby increasing heat dissipation efficiency of the replaceable portion.

BRIEF DESCRIPTION OF THE DRAWINGS

FIGS. 4A and 4B are diagrams illustrating a coupling surface between a first housing and the second housing of the exemplary AVN device.

DETAILED DESCRIPTION

Figure 1:
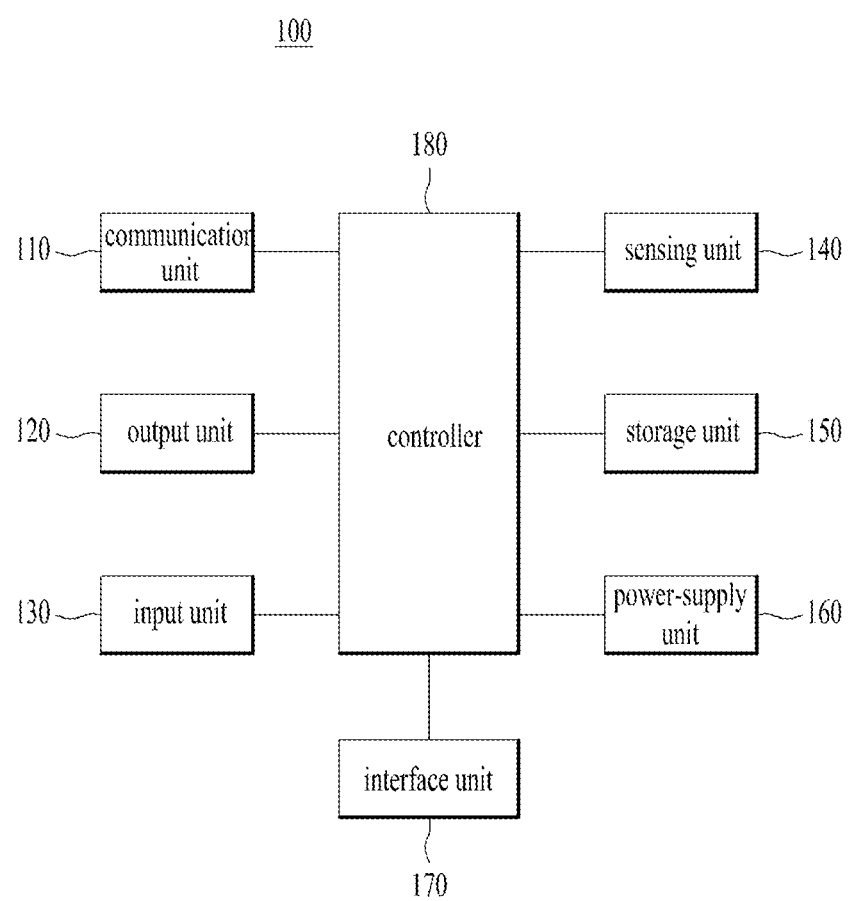
FIG. 1 is a block diagram illustrating an exemplary AVN device.

FIG. 1 is a block diagram illustrating an exemplary AVN device 100.

Referring to FIG. 1, the AVN device 100 can include a communication unit 110, an output unit 120, an input unit 130, a sensing unit 140, a storage unit 150, a power-supply unit 160, an interface unit 170, and a controller 180. The constituent elements shown in FIG. 1 are not always required to implement the AVN device 100, such that the AVN device 100 can include more or fewer components than the elements listed above.

In some implementations, the communication unit 110 can include at least one module for implementing any one of communication between the AVN device 100 and a wireless communication system, communication between the AVN device 100 and another device, or communication between the AVN device 100 and an external server. In addition or alternatively, the communication unit 110 can include at least one module for connecting the AVN device 100 to at least one network.

The communication unit 110 can include at least one of a broadcast reception module, a mobile communication module, a wireless Internet module, a short-range communication module, or a location information module. The antenna can be built in the AVN device 100, or can be disposed at an outer surface of a vehicle.

The output unit 120 can generate output signals related to visual, auditory, tactile sensation, or the like. The output unit 120 can include at least one of a display module or an audio output module. The display module can construct a mutual layer structure along with a touch sensor, or can be formed integrally with the touch sensor, such that the display module can be implemented as a touchscreen. The touchscreen can serve as an input unit 130 that provides an input interface to be used between the AVN device 100 and the user, and at the same time can provide an output interface to be used between the AVN device 100 and the user.

The input unit 130 can include a camera (or an image input unit) for receiving image signals, a microphone (or an audio input unit) for receiving audio signals, and a user input unit (e.g., a touch key, a mechanical key, etc.) for receiving information from the user. Voice data or image data collected by the input unit 130 can be analyzed so that the analyzed result can be processed as a control command of the user as necessary.

The input unit 130 can be configured to input image information (or image signals), audio information (or audio signals), data, or information input by the user, and can include at least one camera for inputting image information. The camera can be a part of the AVN device 100, or can be a structure including the AVN device 100. For example, the camera and the AVN device 100 can include at least some common features or configurations. The camera can process image frames such as still images or moving images obtained by the image sensor in a photographing mode. The processed image frame can be displayed on the display unit or stored in the storage unit 150. The camera provided in the AVN device 100 can be arranged to form a matrix structure inside the vehicle. Through the camera forming the matrix structure, the plurality of image information having various angles or focuses can be input to the AVN device 100. In some implementations, the camera can be a stereo vision camera or a TOF camera to implement 3D images.

The sensing unit 140 can include one or more sensors configured to sense internal information of the AVN device 100, peripheral environmental information of the AVN device 100, user information, and the like. For example, the sensing unit 140 can include at least one of a proximity sensor, an illumination sensor, a touch sensor, an acceleration sensor, a magnetic sensor, a gravity sensor (G-sensor), a gyroscope sensor, a motion sensor, an RGB sensor, an infrared (IR) sensor, a fingerprint scan sensor, an ultrasonic sensor, an optical sensor, an environment sensor (for example, a barometer, a hygrometer, a thermometer, a radioactivity detection sensor, a thermal sensor, and a gas sensor, etc.), or a chemical sensor (for example, an electronic nose, a healthcare sensor, a biometric sensor, and the like). In some implementations, the AVN device 100 can combine various kinds of information sensed by at least two of the above-described sensors, and can use the combined information. Various sensors included in the sensing unit 140 will be described in more detail.

The proximity sensor can detect an object approaching a designated detection surface or whether or not an object is present around the proximity sensor using electromagnetic force or infrared light without mechanical contact. The proximity sensor can be disposed in the inner area of the AVN device 100 surrounded by a touchscreen or can be disposed around the touchscreen.

For example, the proximity sensor can be a transmissive photoelectric sensor, a direct reflective photoelectric sensor, a mirror reflective photoelectric sensor, a high-frequency oscillating proximity sensor, a capacitive proximity sensor, a magnetic proximity sensor, an infrared proximity sensor, etc. If the touchscreen is a capacitive touchscreen, the proximity sensor can be configured to detect proximity of an object having conductivity through change in an electric field according to proximity of the object. In this case, the touchscreen (or a touch sensor) itself can be regarded as a proximity sensor.

For convenience of description, an action in which an object is brought close to the touchscreen without contact and thus it is recognized that the object is located on the touchscreen refers to "proximity touch", and an action in which an object actually contacts the touchscreen refers to "contact touch". A proximity touch position of an object on the touchscreen can refer to a position of the touchscreen vertically corresponding to the object when the object is in the proximity touch state on the touchscreen. The proximity sensor can sense proximity touch and a proximity touch pattern (for example, a proximity touch distance, a proximity touch direction, a proximity touch speed, a proximity touch time, a proximity touch position, a proximity touch moving state, etc.). The controller 180 can process data (or information) corresponding to the proximity touch operation and the proximity touch pattern sensed by the proximity sensor, and output visual information corresponding to the processed data on the touchscreen. Further, the controller 180 can control the AVN device 100 so as to process different operations or data (or information) according to whether or not touch of the object at the same point of the touchscreen is proximity touch or contact touch.

The touch sensor senses touch (or touch input) applied to the touchscreen (or the display unit) using at least one of various touch methods, i.e., a resistive method, a capacitive method, an infrared method, an ultrasonic method, a magnetic field method, etc.

For example, the touch sensor can be configured to convert change in pressure applied to a specific region of the touchscreen or capacitance generated from a specific region of the touchscreen into an electrical input signal. The touch sensor can be configured to detect a touch position of an object on the touchscreen, a touch area of the object, a touch pressure of the object, a capacitance of the object, etc. The object is an article touching the touchscreen and, for example, may be a finger, a touch pen or stylus, or a pointer.

In some implementations, when touch inputs are sensed by the touch sensors, corresponding signals can be transmitted to a touch controller. The touch controller can process the received signals, and then transmit corresponding data to the controller 180. Accordingly, the controller 180 can sense which region of the display unit 151 has been touched. The touch controller can be a component separate from the controller 180 or the controller 180 itself.

The controller 180 can perform different control according to types of objects touching the touchscreen (or a touch key provided in other regions than the touchscreen), or perform equal control regardless of types of objects touching the touchscreen. Whether or not different control is performed or equal control is performed according to types of objects can be determined according to the current operating state of the AVN device 100 or an application program which is being executed.

The above-described touch sensor or proximity sensor can be independently used or be combined to sense various types of touch, such as short (or tap) touch, long touch, multi-touch, drag touch, flick touch, pinch-in touch, pinch-out touch, swipe touch, hovering touch, etc., on the touchscreen.

The storage unit 150 can store data for supporting various functions of the AVN device 100. The storage unit 150 can store a plurality of application programs (or applications) executed in the AVN device 100, data for operations of the AVN device 100, instructions, and the like. At least some of the application programs can be downloaded from an external server via wireless communication. In some implementations, some of the application programs can be installed within the AVN device 100 at the time of being manufactured and shipped for basic functions of the AVN device 100 (for example, a navigation function, artificial intelligence (AI) function, a broadcast reception function, and a broadcast output function, etc.). In some implementations, the application programs can be stored in the storage unit 150, installed in the AVN device 100, and executed by the controller 180 to perform an operation (or a function) of the AVN device 100.

The power-supply unit 160 can receive external power or internal power under control of the controller 180, such that the power-supply unit 160 can supply the received power to the constituent components included in the AVN device 100. The power-supply unit 160 can include a battery included in the vehicle. The battery can be implemented as an embedded battery or a replaceable battery.

The interface unit 170 can serve as an interface with various types of external devices connected to the AVN device 100. The interface unit 170 can include at least one of wired/wireless headset ports, an external charger port, wired/wireless data ports, a memory card port, or a port for connection with a device provided with an identification module. In response to connection of an external device to the interface unit 170, the AVN device 100 can perform proper control regarding the connected external device.

The interface unit 170 can include a user interface (UI) for interacting with the user. Since a user interface (UI) based on voice or vision can be provided, it is possible to perform complex functions of the AVN device 100 without action of the user who directly touches the AVN device 100.

The user interface (UI) based on touch input can be considered dangerous in a vehicle driving process in which the user should interact with the AVN device 100 while looking at the AVN device 100. In contrast, the user interface (UI) based on voice or vision can enable the user to interact with the AVN device 100 without looking at the AVN device 100, so that this voice or vision-based UI can be considered more appropriate for the AVN device 100.

However, the voice-based UI may have limitations depending on the surrounding environments. For example, the voice-based UI may have difficulty in distinguishing voice of the user who drives the vehicle, if there is another passenger in the vehicle or the indoor space of the vehicle is in a noisy state due to noise received from outside through an opened window. In addition, it is inconvenient for the user to interact with the AVN device through his or her voice, when another passenger in the vehicle is on the phone or is resting.

Therefore, the vision-based user interface (UI) can provide convenience for the user to interact with the AVN device. Accordingly, technology for enabling the AVN device to interact with the user through the vision-based UI has recently been actively researched.

In addition to the operations related to the application program installed in the AVN device 100, the controller 180 can control overall operation of the AVN device 100, thereby performing vehicle control. The controller 180 can process input/output (I/O) signals, data, information, etc. through the above-described components, or can provide the application program stored in the storage unit 150, so that the controller 180 can provide the user with appropriate information or functions or can process necessary operations.

Figure 2:
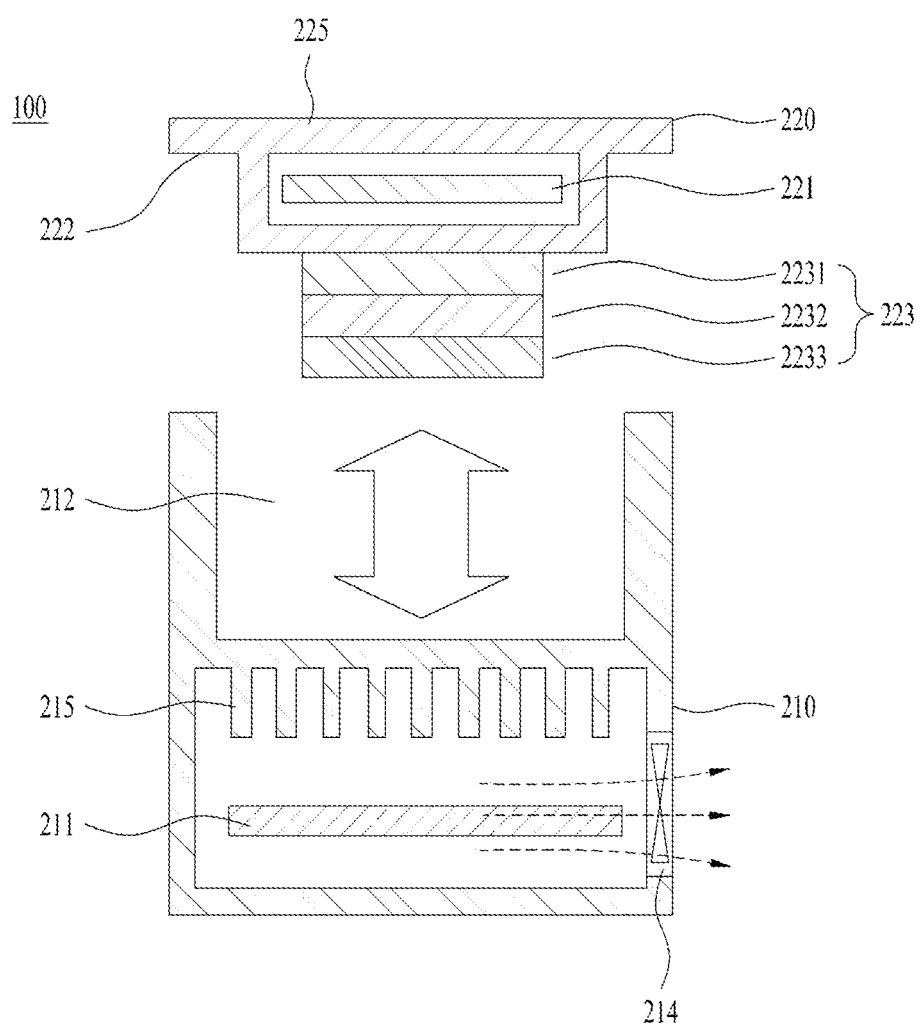
FIG. 2 is a conceptual diagram illustrating an exemplary AVN device.

FIG. 2 is a conceptual diagram illustrating the exemplary AVN device 100.

The AVN device 100 can include a first housing 210 and a second housing 220 detachably coupled to the first housing 210. The first housing 210 can be a fixed portion fixed to the vehicle, and the second housing 220 can be a replaceable (or changeable) unit. For example, the first housing can be directly embedded in the vehicle and connected thereto.

The first housing 210 can include a first circuit board 211 in an internal mounting space, and the second housing 220 can include a second circuit board 221 in an internal mounting space. The first circuit board 211 can be connected to a first electronic component provided in the first housing 210, and the second circuit board 221 can be connected to a second electronic component provided in the second housing 220. In some implementations, the AVN device 100 can include a single circuit board in the first housing 210 or the second housing 220, and the single circuit board can be coupled to the first electronic component provided in the first housing 210 and the second electronic component provided in the second housing 220.

The second electronic component provided in the second housing 220 may have a shorter replacement cycle than the first electronic component provided in the first housing 210. The replacement cycle may be determined differently depending on a period in which upgraded electronic components are introduced to the market due to rapid development of technology, or may be determined differently according to durability or function degradation rate.

For example, the first electronic component may be a fixed component that includes at least one of audio, vehicle interlocking components, or radio. In some implementations, the fixed component may be a component that need not be replaced or has a very long replacement cycle. The second electronic component may be a replaceable component that includes at least one of a CPU, a memory, or a communication device. In some implementations, the interlocking component may be a component having a replacement cycle shorter than that of the fixed component.

The first circuit board 211 and the second circuit board 221 can be configured to conduct electricity through terminals thereof when the first housing 210 and the second housing 220 are coupled to each other. When the first circuit board 211 and the second circuit board 221 are electrically connected, the entire AVN device 100 can be controlled through a CPU (i.e., controller) provided in the second circuit board 221.

In some implementations, the second housing 220 serving as a replaceable portion can be detachably coupled to the first housing 210, electronic components (hereinafter referred to as long-term electronic components) each having a long replacement cycle or permanent electronic components that need not be replaced with new ones can be provided in the first housing 210, and other electronic components (hereinafter referred to as short-term electronic components) each having a short replacement cycle can be provided in the second housing 220, so that the AVN device 100 can be upgraded by replacing only the second housing 220 with a new one according to a replacement cycle of the second housing 220. In some implementations, in order to replace the short-term electronic component having a short replacement cycle with a new one, it is not necessary for the entire AVN device 100 to be replaced with a new AVN device, thereby reducing waste of resources. In addition, the second housing 220 is detachably provided in the AVN device, thereby providing the user with greater convenience in replacement. In recent times, as the demand for the AVN device 100 manufactured as a built-in type is rapidly increasing, the AVN device 100 can be manufactured in different shapes according to vehicle models. Accordingly, the first housing 210 can be manufactured as a built-in type in response to vehicle models, and the second housing 220 can be manufactured according to a unified standard regardless of vehicle model types, so that waste of resources can be reduced.

The first housing 210 can include a coupling portion 212 that defines an accommodation space to which the second housing 220 is coupled. The second housing 220 can include a coupling surface 222 that is in contact with the coupling portion 212 when connected to the coupling portion 212, and an exposed surface 225 exposed outside when connected to the coupling portion 212. The second housing 220 can emit heat generated therein to the outside through the exposed surface 225. For example, the second housing 220 can discharge heat generated in the second circuit board 221 to the outside using convection and radiation through the exposed surface 225. The second housing 220 can be made of a metal material to easily discharge internal heat through the exposed surface 225. In some implementations, heat generated in the second housing 220 can be conducted to the first housing 210 and dissipated to the outside. In order to easily conduct heat generated in the second housing 220 to the first housing 210, the first housing 210 can be made of a metal material. For example, the coupling portion 212 of the first housing 210 can be made of a metal material, and the remaining parts other than the coupling portion 212 can be made of a plastic material.

The AVN device 100 can include a conduction module 223 provided at one surface of the first housing 210 or at one surface of the second housing 220. For example, the AVN device 100 can include a conduction module 223 installed on the coupling surface 222 of the second housing 220.

When the second housing 220 is coupled to the first housing 210, the conduction module 223 can be provided between the first housing 210 and the second housing 220 to function as a passage for heat exchange. For example, the conduction module 223 can include an adhesive sheet 2231 attached to either one surface of the first housing 210 or one surface of the second housing 220, a thermally conductive sheet 2232 stacked on the adhesive sheet 2231, and a non-adhesive sheet 2233 stacked on the thermally conductive sheet 2232. The adhesive sheet 2231 can be a double-sided adhesive sheet attached to one surface of the first housing 210 or attached to one surface of the second housing 220. The thermally conductive sheet 2232 can be a sheet made of a material having high thermal conductivity. The non-adhesive sheet 2233 can be stacked on the thermally conductive sheet 2232, so that one surface of the non-adhesive sheet 2233 adheres to the thermally conductive sheet 2232, and the other surface the non-adhesive sheet 2233 does not have adhesive properties.

The first housing 210 can include a fan 214 for discharging heat generated therein to the outside. Since the first housing 210 serves as a fixed portion, the first housing 210 can have a larger size and a larger spare space than the second housing 220. Thus, in some implementations, the fan 214 can be included in the first housing 210 rather than in the second housing 220. In addition or alternatively, the fan 214 can be provided in the first housing 210 rather than the second housing 220 because the fan 214 is considered to be a permanent electronic component having a long replacement cycle, but is not limited thereto, If necessary, the fan 214 can be provided in the second housing 220. In this case, the fan 214 provided in the first housing 210 can have superior performance to the other fan provided in the second housing 220.

In addition, the first housing 210 can include a plurality of metal fins 215 protruding from the inner surface thereof. The metal fins 215 can be configured to widen the inner surface of the first housing 210 so that heat transferred from the second housing 220 can be dissipated to the inner space of the first housing 210 and dissipated to the outside through the fan 214.

A process in which heat generated in the second housing 220 is dissipated to the outside will hereinafter be described in detail.

Figure 3:
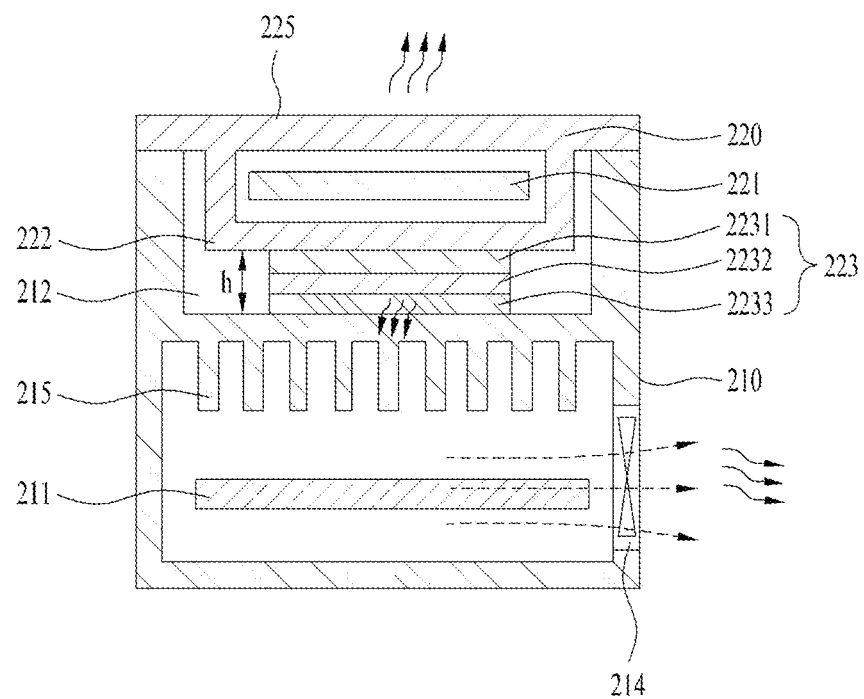
FIG. 3 is a diagram illustrating movement of heat generated inside a second housing of the exemplary AVN device.

FIG. 3 is a diagram illustrating movement of heat generated inside the second housing 220 of the exemplary AVN device 100.

The second circuit board 221 provided in the second housing 220 can control the AVN device 100 and perform calculation of the AVN device 100, so that the second circuit board 221 can have a greater amount of heat generated therein as compared to the first circuit board 211. Therefore, the structure designed to emit heat generated in the second housing 220 to the outside may be considered more important.

Heat generated in the second housing 220 may be emitted to the outside through convection and radiation on the exposed surface 225. The second housing 220 can include the exposed surface 225 having a high-conductivity metal material so as to facilitate convection and radiation on the exposed surface 225.

In some implementations, the second housing 220 can serve as a replaceable portion, and can be detachably coupled to the first housing 210 acting as a fixed portion. When the second housing 220 is coupled to the first housing 210, heat generated in the second housing 220 can be conducted to the first housing 210 and dissipated to the outside.

For example, heat conducted from the second housing 220 to the first housing 210 can be dissipated to the outside through convection and radiation at the surface of the second housing 220. At this time, the fan 214 provided in the first housing 210 can perform a function of cooling the first housing 210. For example, heat generated in the second housing 220 can be dissipated to the outside through the fan 214 of the first housing 210 to which the second housing 220 is coupled.

In order to easily transfer heat generated in the second housing 220 to the first housing 210, the AVN device 100 can include a conduction module 223 and a metal fin 215.

The conduction module 223 can fix the thermally conductive sheet 2232 through the adhesive sheet 2231, and may not block the second housing 220 from being attached to and detached from the first housing 210 using the non-adhesive sheet 2233.

The conduction module 223 can be compressed when the second housing 220 is coupled to the first housing 210, so that the conduction module 223 can be in surface contact with both the first housing 210 and the second housing 220 at the same time. The conduction module 223 may easily conduct heat generated in the second housing to the first housing 210 through surface contact. A detailed description thereof will be given with reference to FIG. 4.

The conduction module 223 can have a larger thickness than an assembly tolerance (h) between the first housing 210 and the second housing 220. In addition, the thickness of the conduction module 223 can be equal to or less than a thickness that does not interfere with coupling between the first housing 210 and the second housing 220. For example, the conduction module 223 has a thickness that does not interfere with coupling between the first housing 210 and the second housing 220, and at the same time when it is compressed, the conduction module 223 can have a thickness that enables the conduction module 223 to be simultaneously in surface contact with both the first housing 210 and the second housing.

In some implementations, the plurality of metal fins 215 can be provided at the inner surface of the first housing 210, so that heat generated in the second housing 220 can be easily conducted to the first housing 210. For example, the metal fins 215 provided at the inner surface of the first housing 210 can enlarge a contact area where heat conducted to the first housing 210 is dissipated to the inside of the first housing 210 to perform cooling of the first housing 210, resulting in increased efficiency for enabling heat generated in the second housing 220 to be conducted to the first housing 210.

In some implementations, the metal fins 215 can be provided at one surface, which faces or is opposite to the outer surface of the first housing 210 contacting the second housing 220, from among the inner surface of the first housing 210. For example, heat generated by the second housing 220 can be convectively radiated to the inside of the first housing 210 along the metal fins 215 of the first housing 210, and can be dissipated to the outside through the fan 214.

FIGS. 4A and 4B are diagrams illustrating a coupling surface between the first housing 210 and the second housing 220 for use in the exemplary AVN device 100. For better understanding of the present disclosure, the following description of FIG. 4 will be given by further referring to FIG. 3 as necessary.

In some implementations, the first housing 210 and the second housing 220 can be detachably coupled to each other, and may not be integrated into one unit. Therefore, although the first housing 210 and the second housing 220 are coupled to each other, a gap (or a void) 232 may be formed around the coupling portion between the first housing 210 and the second housing 220.

Specifically, FIG. 4A is a diagram illustrating an example in which the gap 232 is formed in the coupling portion between the first housing 210 and the second housing 220 in a situation where the conduction module 223 is not included in the AVN device 100. When the second housing 220 is coupled to the first housing 210, the coupling portion 212 of the first housing 210 and the coupling surface 222 of the second housing 220 are in point contact 231 with each other without being completely in close contact with each other, resulting in formation of the gap 232. The generated gap 232 may decrease conduction of heat from the second housing 220 to the first housing 210.

To address this problem, the AVN device may allow the conduction module 223 to be disposed between the first housing 210 and the second housing 220. Specifically, FIG. 4B is a diagram illustrating an example in which the conduction module 223 is compressed and is thus in surface contact 233 with both the coupling portion 212 of the first housing 210 and the coupling portion 222 of the second housing 220 at the same time.

That is, the present disclosure is characterized in that thermal conductivity reduction caused by detachable coupling between the first housing 210 and the second housing 220 can be compensated through the conduction module 223.

Figure 5B:
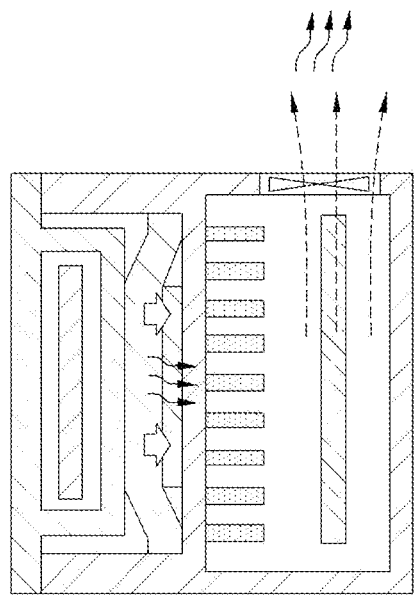
FIGS. 5A and 5B are conceptual diagrams illustrating another exemplary AVN device.
Figure 5A:
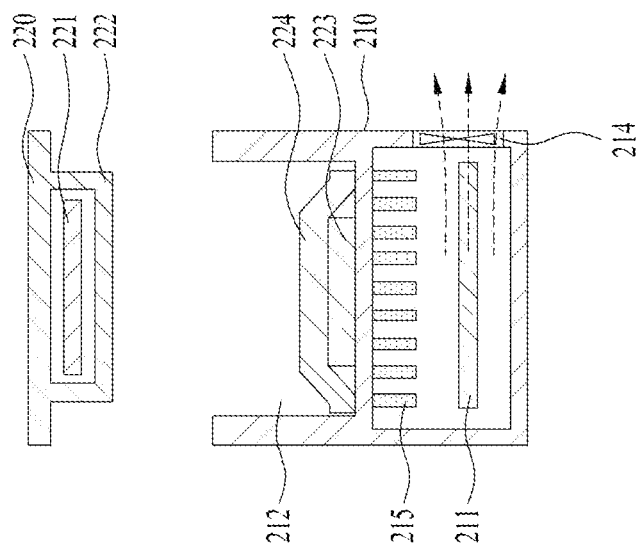

FIGS. 5A and 5B are conceptual diagrams illustrating another exemplary AVN device 100. For convenience of description, the AVN device 100 shown in FIGS. 5A and 5B will hereinafter be described based on characteristics that are different from those of FIGS. 2 and 3.

In some implementations, the conduction module 223 is provided in the second housing 220 acting as the replaceable portion, so that the conduction module 223 can also be replaced simultaneously with replacement of the second housing 220.

The conduction module 223 can be compressed when the second housing 220 is coupled to the first housing 210. If the conduction module 223 is used for a long time, the conduction module 223 may be deformed, so that the contact area between the second housing 220 and the first housing 210 may be reduced in size. Therefore, it may be preferable that the conduction module 223 is replaced together with the second housing 220, rather than being used in a fixed manner within the first housing 210.

However, when the degree of deformation of the conduction module 223 is not large, the conduction module 223 may be provided in the first housing 210 so as to be used in a fixed manner. In this case, when the conduction module 223 is directly exposed to the outside, a foreign material may be caught in a gap between the first housing 210 and the second housing 220, so that the contact area between the first housing 210 and the second housing 220 is reduced in size. As a result, thermal conductivity for enabling heat generated in the second housing 220 to be transferred to the first housing 210 may decrease. Therefore, the present disclosure may allow the conduction module 223 to be disposed at the outer surface of the first housing 210, and may further include a metal sheet 224 formed to cover the conduction module 223.

FIG. 5A is a diagram illustrating an example in which the conduction module 223 is included in the coupling portion 212 of the first housing 210, and the metal sheet 224 is formed to cover the conduction module 223. FIG. 5B is a diagram illustrating that the second housing 220 is coupled to the first housing 210 so that the conduction module 223 is compressed.

As depicted in FIG. 5B, the conduction module 223 is compressed so that the compressed conduction module 223 can be simultaneously in surface contact with the coupling portion 212 of the first housing 210 and the metal sheet 224. However, the coupling surface 222 between the metal sheet 224 and the second housing 220 may be in point contact as shown in FIG. 4A, resulting in formation of a gap. However, contact force caused by external force generated by compression of the conduction module 223 occurs in the second coupling surface 222 between the metal sheet 224 and the second housing 220, resulting in formation of a smaller gap as compared to FIG. 4A. Accordingly, heat generated inside the second housing 220 may be conducted to the first housing 210, so that the conducted heat can be easily dissipated to the outside.

What is claimed is:

1. An audio video navigation (AVN) device comprising:
   a first housing including a first circuit board and a first electronic component;
   a second housing that includes a second circuit board and a second electronic component, and that detachably couples to the first housing;
   a conduction module provided between a first coupling surface of the first housing and a second coupling surface of the second housing based on the second housing being coupled to the first housing; and
   a heat dissipation fan that is provided at the first housing and that is configured to exhaust air inside the first housing to an outside of the first housing,
   wherein the first housing defines an accommodation space in which the second housing is accommodated and in which the first coupling surface is received,
   wherein the conduction module includes:
   a first surface attached to one of the first coupling surface or the second coupling surface, and
   a second surface facing the other one of the first coupling surface or the second coupling surface,
   wherein the second surface is not adhesive
   wherein the first electronic component is a fixed component that includes at least one of a vehicle interlocking component, a radio, or an audio device, and
   wherein the second electronic component is a replaceable component that includes at least one of a central processing unit (CPU), a memory, or a communication device.

2. The AVN device according to claim 1, wherein the conduction module includes:
   an adhesive sheet that has a first surface attached to the first housing or the second housing,
   a thermally conductive sheet stacked on a second surface of the adhesive sheet, and
   a non-adhesive sheet that is stacked on the thermally conductive sheet and that defines a non-adhesive surface.

3. The AVN device according to claim 1, wherein:
   a thickness of the conduction module is greater than an assembly tolerance between the first housing and the second housing, and
   the conduction module is compressed according to a degree of compression of the first housing that is compressed based on the first housing being coupled to the second housing, so that a surface of the conduction module is in contact with the first housing and the second housing.

4. The AVN device according to claim 1, wherein the first housing includes:
   a plurality of metal fins protruding from an inner surface of the first coupling surface, and
   wherein the heat dissipation fan is configured to guide a flow of the air inside the first housing through the plurality of metal fins.

5. The AVN device according to claim 1, wherein the second housing includes:
  a coupling surface that is received in the accommodation space of the first housing, and
  an exposed surface that is exposed to an outside of the second housing.

6. The AVN device according to claim 1, wherein the first housing further includes:
  a metal sheet that covers the conduction module and that couples the conductive module to the first coupling surface.

7. The AVN device according to claim 1, comprising:
  a terminal electrically connecting the first circuit board and the second circuit board based on the first housing and the second housing being coupled to each other.

8. The AVN device according to claim 7, further comprising:
  a first electronic component mounted in the first housing; and
  a second electronic component that is mounted in the second housing and that has a shorter replacement cycle than the first electronic component,
  wherein the second electronic component is a processor, and
  wherein the processor controls an operation of the AVN device based on the first circuit board and the second circuit board being connected by the terminal.

9. The AVN device according to claim 4, wherein the inner surface of the first coupling surface faces an outer surface of the first housing that contacts the second housing.

10. The AVN device according to claim 1, wherein:
  the fixed component includes the vehicle interlocking component, the radio, and the audio device, and the replaceable component includes the CPU.

11. The AVN device according to claim 1, wherein:
  the fixed component includes the vehicle interlocking component, the radio, and the audio device, and the replaceable component includes the memory.

12. The AVN device according to claim 1, wherein:
  the fixed component includes the vehicle interlocking component, the radio, and the audio device, and the replaceable component includes the communication device.

13. The AVN device according to claim 1, wherein:
  the fixed component includes the vehicle interlocking component and the radio, and the replaceable component includes the CPU.

14. The AVN device according to claim 1, wherein:
  the fixed component includes the vehicle interlocking component and the radio, and the replaceable component includes the memory.

15. The AVN device according to claim 1, wherein:
  the fixed component includes the vehicle interlocking component and the radio, and the replaceable component includes the communication device.

16. The AVN device according to claim 1, wherein:
  the fixed component includes the vehicle interlocking component, the radio, and the audio device, and the replaceable component includes the CPU, the memory, and the communication device.

17. The AVN device according to claim 1, wherein:
  the fixed component includes the radio and the audio device, and
  the replaceable component includes the CPU, the memory, and the communication device.

* * * * *